United States Patent [19]

Jesser

[11] Patent Number: 5,793,255
[45] Date of Patent: Aug. 11, 1998

[54] TUNED RF AMPLIFIER

[75] Inventor: Edward A. Jesser, Los Gatos, Calif.

[73] Assignee: ACS Wireless, Inc., Scotts Valley, Calif.

[21] Appl. No.: 678,807

[22] Filed: Jul. 12, 1996

[51] Int. Cl.⁶ .................................................. H03F 1/34
[52] U.S. Cl. ...................................... 330/290; 330/294
[58] Field of Search .............................. 330/76, 78, 79, 330/80, 97, 99, 100, 104, 107, 109, 156, 290, 294, 292

[56] References Cited

U.S. PATENT DOCUMENTS 3,151,301  9/1964  Bettin ............................. 330/98
4,074,241  2/1978  Kranz ........................... 330/294 X
5,218,323  6/1993  Ohno ............................. 330/290

*Primary Examiner*—James B. Mullins
*Attorney, Agent, or Firm*—Limbach & Limbach L.L.P.

[57] ABSTRACT

A tuned radio frequency (RF) amplifier includes serially connected input and output common emitter amplifiers with closed ac and dc loops for maintaining high input impedance and low output impedance. The closed ac loop includes a parallel resonant circuit which is connected to the input and capacitively coupled to the output and across which a small signal appears as the difference between the input and output signals. The collector of the input amplifier transistor is maintained at a constant voltage, thereby minimizing any Miller Effect feedback capacitance, and, therefore, any RF degeneration, at the input.

8 Claims, 1 Drawing Sheet

TUNED RF AMPLIFIER

BACKGROUND OF THE INVENTION

1. Field of the Invention

The present invention relates to tuned RF amplifiers, and in particular, to tuned RF amplifiers having high input impedance ($Z_{in}$) and low output impedance ($Z_{out}$).

2. Description of the Related Art

When coupling to an electrically short antenna (e.g., less than one quarter wavelength), pre-amplifiers in the form of tuned RF amplifiers are typically used to pre-amplify the incoming signal prior to frequency down conversion in a mixer. Typical conventional pre-amplifiers include bipolar junction transistors (BJTs) with a serial input inductance for matching to the capacitive reactance of the antenna, or, alternatively, field effect transistors (FETs) for maintaining a high input impedance. However, such conventional amplifiers suffer from a number of drawbacks.

In the case of the BJT amplifier, due to its high output impedance at its collector terminal, some form of reactive matching circuit (including one or more inductances) is needed to match to the low system impedance (e.g., 50 ohms). This results in an output which must be tuned to match its load impedance and which may interact with reactances within the load in an undesired manner. Another problem is the RF signal losses resulting from the relatively low quality (Q) factor of the inductances due to the DC resistances within such inductances.

In the case of the FET amplifiers, the input, i.e., the gate terminal, has a relatively high input capacitance which when connected in series with the effective capacitance of the antenna reduces the effective RF input signal due to a voltage division effect across the two series capacitances.

Accordingly, it would be desirable to have an RF amplifier which is tuned to have a high input impedance and low output impedance while minimizing RF signal losses when receiving signals from an electrically short antenna.

SUMMARY OF THE INVENTION

A tuned RF amplifier in accordance with the present invention maintains a high input impedance and a low output impedance by providing high current gain with no voltage gain, while also maintaining a low noise figure, by using a closed loop amplifier configuration. The high input impedance is advantageous when coupling to and receiving RF signals from an electrically short antenna, while the low output impedance is advantageous for driving a low impedance load such as an RF mixer.

A tuned radio frequency (RF) amplifier in accordance with the present invention includes first and second common emitter amplifiers and an ac feedback circuit. The first common emitter amplifier is configured to receive, via its input, and amplify an input RF signal and in accordance therewith provide an intermediate RF signal. The second common emitter amplifier is coupled to the first common emitter amplifier and is configured to receive and amplify the intermediate RF signal and in accordance therewith provide an output RF signal via its output. The ac feedback circuit is coupled between the second amplifier output and the first amplifier input and includes a resonant circuit across which the signal developed corresponds to the difference between the input and output RF signals.

In accordance with one embodiment of the present invention, the tuned RF amplifier includes: a power supply node; a circuit ground node; first and second transistors; three resistors; and a reactive circuit. The second transistor base is coupled to the first transistor collector and the second transistor emitter is coupled to the power supply node. The first resistor is coupled between the first transistor collector and the power supply node. The second resistor is coupled between the second transistor collector and the first transistor emitter. The third resistor is coupled between the first transistor emitter and the circuit ground node. The reactive circuit is coupled between the second transistor collector and the first transistor base.

These and other features and advantages of the present invention will be understood upon consideration of the following detailed description of the invention and the accompanying drawings.

DETAILED DESCRIPTION OF THE INVENTION

Figure 1:
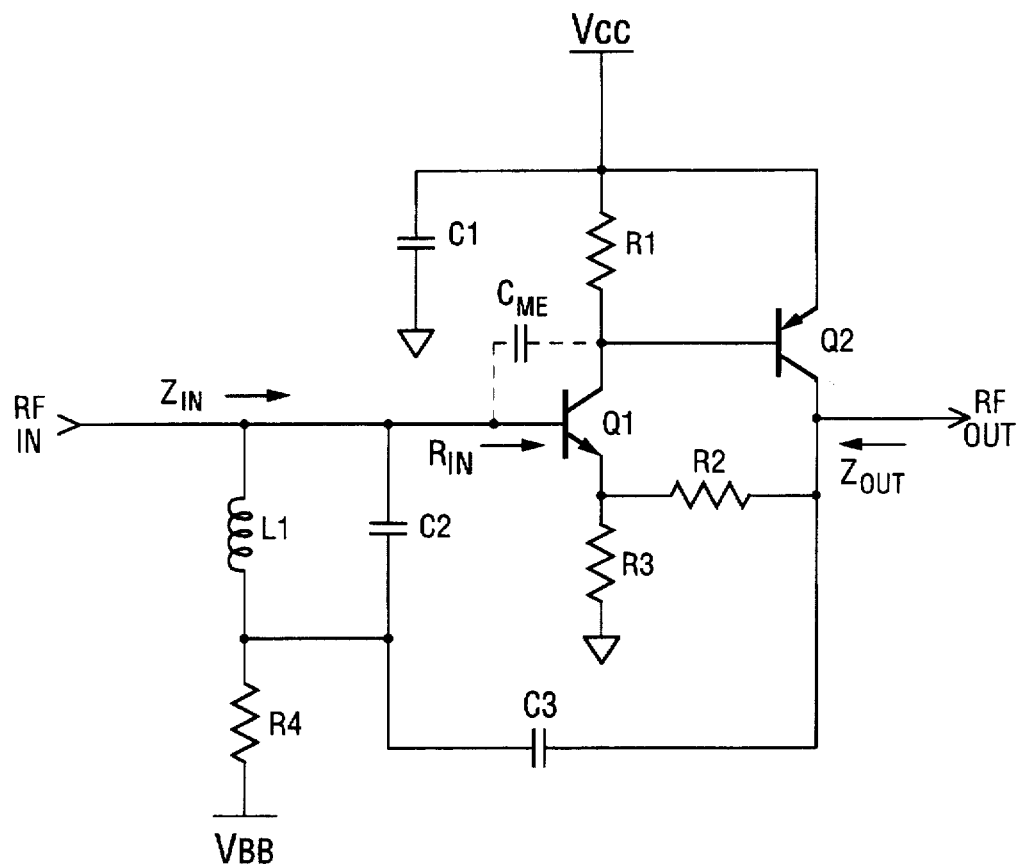
FIG. 1 is a schematic diagram of a tuned RF amplifier in accordance with one embodiment of the present invention.

Referring to FIG. 1, a tuned RF amplifier in accordance with one embodiment of the present invention includes input and output common emitter amplifiers which are interconnected in closed AC and DC loops. The first amplifier circuit includes NPN transistor Q1 whose collector is biased by a power supply voltage VCC via resistor R1 and whose emitter is grounded through resistor R3. The power supply node is bypassed to circuit ground with capacitor C1. The base of transistor Q1 is biased by a base supply voltage VBB through biasing and isolation resistor R4 and inductor L1. Inductor L1 and capacitor C2 form a parallel resonant, or "tank," circuit which is resonant at the desired frequency of operation $f_o$.

The second amplifier circuit includes PNP transistor Q2 whose emitter is biased by the power supply voltage VCC, whose base is connected directly to the collector of transistor Q1 and whose collector provides the RF output signal.

A closed DC loop is formed by coupling the collector of transistor Q2 to the emitter of transistor Q1 via feedback resistor R2. A closed AC loop is formed by coupling the collector of transistor Q2 to the base of transistor Q1 via the serially connected tank circuit L1/C2 and feedback capacitor C3.

With the collector of transistor Q1 connected directly to the base of transistor Q2 whose emitter is connected directly to the power supply VCC node, the voltage at the collector of transistor Q1 remains constant at one base-emitter voltage $V_{be}$ drop below the power supply potential VCC. Accordingly, the collector of transistor Q1 forms a current node in the sense that virtually no voltage fluctuation takes place. This virtually eliminates effects from the Miller Effect feedback capacitance $C_{ME}$ existing between the collector and base terminals of transistor Q1. This, in turn, virtually eliminates any RF degeneration otherwise caused by effects from such feedback capacitance.

The DC feedback provided by resistor R2 causes the output signal to be fed back to the emitter of transistor Q1, thereby causing the input resistance $R_{in}$ at the base of transistor Q1 to be increased. The output signal at the collector of transistor Q2 is also fed back through capacitor C3 to the "cold" end of the input tank circuit L1/C2, thereby causing the signal developed across the tank circuit L1/C2 to be a difference between the input and output RF signal voltages, and, therefore, quite small. This causes the input impedance $Z_{in}$ at the base of transistor Q1 to be high and the noise figure to be low.

In accordance with a preferred embodiment of the present invention, the component values for the circuit of FIG. 1 are as follows:

| COMPONENT | VALUE/TYPE |
| --- | --- |
| Q1 | NEC # NE85619 |
| Q2 | Motorola # MMBTH81LT1 |
| L1 | 100 nanohenry (Coilcraft) |
| R1 | 680 ohms |
| R2 | 10 ohms |
| R3 | 430 ohms |
| R4 | 1000 ohms |
| C1 | 0.01 microfarad |
| C2 | 100 picofarad |
| C3 | 220 picofarad |

Resistors R1 and R3 establish the DC current in the first amplifier transistor Q1 while resistor R3 establishes the DC current in the second amplifier transistor Q2, less the current in transistor Q1, in accordance with the base biasing voltage VBB. It should be understood that, in accordance with well known RF amplifier design techniques, the DC currents through transistors Q1 and Q2 can be scaled as desired to match the intermodulation requirements for the particular RF application environment.

Based upon the above-identified component values, the nominal frequency of operation for the circuit of FIG. 1 is approximately 50 Megahertz. This frequency can be modified, as desired, by modifying the ratio between the inductance and capacitance values of inductor L1 and capacitor C2 of the tank circuit and feedback capacitor C3.

Figure 2:
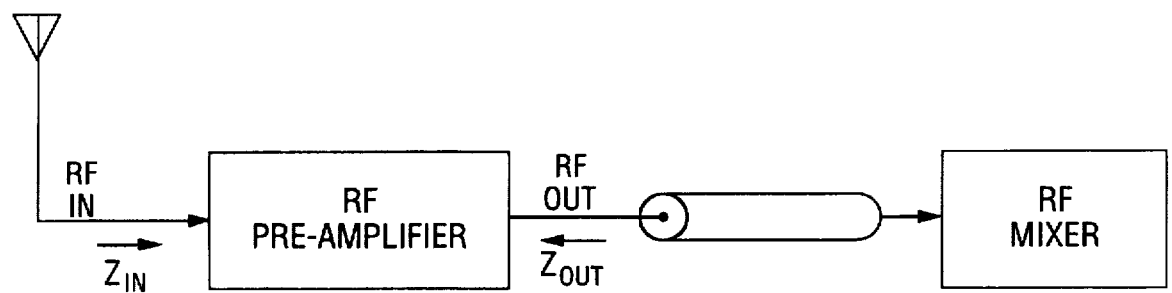
FIG. 2 is a functional block diagram of the front end of an RF receiver for which use of the circuit of FIG. 1 is suitable.

Referring to FIG. 2, the RF amplifier circuit of FIG. 1 is suitable for use as an RF pre-amplifier in the front end of a radio receiver circuit. The high input impedance $Z_{in}$ of the amplifier is advantageous when receiving the RF input signal from an electrically short antenna (e.g., less than one-quarter wavelength), while the low output impedance $Z_{out}$ is advantageous when driving a low impedance transmission line and RF mixer circuit.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a tuned radio frequency (RF) amplifier comprising:

a first common emitter amplifier, including a first amplifier input, configured to receive, via said first amplifier input, and amplify an input RF signal and in accordance therewith provide an intermediate RF signal;

a second common emitter amplifier, coupled to said first common emitter amplifier and including a second amplifier output, configured to receive and amplify said intermediate RF signal and in accordance therewith provide an output RF signal via said second amplifier output; and an ac feedback circuit coupled between said second amplifier output and said first amplifier input and including a resonant circuit;

wherein a signal across said resonant circuit corresponds to a difference between said input RF signal and said output RF signal; and wherein said first common emitter amplifier includes a first collector via which said intermediate RF signal is provided, said first and second common emitter amplifiers are dc-coupled together at said first collector and said first and second common emitter amplifiers are configured to establish and maintain a substantially constant voltage at said first collector.

2. The apparatus of claim 1, wherein said resonant circuit is coupled to said first amplifier input and said ac feedback circuit further comprises a reactive circuit coupled between said resonant circuit and said second amplifier output.

3. The apparatus of claim 1, wherein said first amplifier input has an input impedance, said second amplifier output has an output impedance and said input impedance is greater than said output impedance.

4. The apparatus of claim 1, wherein said input RF signal has an input RF signal voltage and an input RF signal current, said output RF signal has an output RF signal voltage and an output RF signal current, said output RF signal current is greater than said input RF signal current and said input RF signal voltage is greater than said output RF signal voltage.

5. The apparatus of claim 1, further comprising a dc feedback circuit coupled between said second amplifier output and said first common emitter amplifier.

6. The apparatus of claim 5, wherein said first common emitter amplifier includes a first emitter and said dc feedback circuit is coupled between said second amplifier output and said first emitter.

7. An apparatus including a tuned radio frequency (RF) amplifier comprising:

a power supply node;

a circuit ground node;

a first transistor including a first base, a first emitter and a first collector;

a second transistor including a second base, a second emitter and a second collector, wherein said second base is coupled to said first collector and said second emitter is coupled to said power supply node;

a first resistor coupled between said first collector and said power supply node;

a second resistor coupled between said second collector and said first emitter;

a third resistor coupled between said first emitter and said circuit ground node; and a reactive circuit coupled between said second collector and said first base, wherein said reactive circuit includes a parallel resonant circuit and a first capacitor serially coupled together.

8. The apparatus of claim 7, further comprising a second power supply node and a fourth resistor which is coupled between said reactive circuit and said second power supply node.

* * * * *